(12) United States Patent
Morishita

(10) Patent No.: US 7,495,265 B2
(45) Date of Patent: Feb. 24, 2009

(54) ESD PROTECTION CIRCUIT WITH SCR STRUCTURE FOR SEMICONDUCTOR DEVICE

(75) Inventor: Yasuyuki Morishita, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 142 days.

(21) Appl. No.: 11/405,531

(22) Filed: Apr. 18, 2006

(65) Prior Publication Data

US 2006/0232898 A1 Oct. 19, 2006

(30) Foreign Application Priority Data

Apr. 19, 2005 (JP) ............................. 2005-121428

(51) Int. Cl.
*H01L 29/72* (2006.01)
(52) U.S. Cl. .................. 257/173; 257/115; 257/123; 257/355; 257/536; 361/56
(58) Field of Classification Search ................. 257/115, 257/123, 173, 355, 536; 361/56
See application file for complete search history.

(56) References Cited

U.S. PATENT DOCUMENTS 5,591,992 A 1/1997 Leach
5,744,842 A * 4/1998 Ker ............................. 257/362
6,469,325 B1 * 10/2002 Ishizuka et al. ............. 257/173
2003/0218841 A1 * 11/2003 Kodama ....................... 361/56

FOREIGN PATENT DOCUMENTS

JP 2002-93919 3/2002
JP P2003-203985 A 7/2003

OTHER PUBLICATIONS

Japanese Office Action dated Aug. 3, 2007 with partial English translation.
Chinese Office Action dated Apr. 4, 2008 with English Translation.

* cited by examiner

*Primary Examiner*—Edward Wojciechowicz
(74) *Attorney, Agent, or Firm*—McGinn IP Law Group, PLLC

(57) ABSTRACT

An ESD protection structure has: a first P-type semiconductor region connected to a pad; a first N-type semiconductor region coupled with the first P-type semiconductor region; a second P-type semiconductor region coupled with the first N-type semiconductor region and connected to a ground terminal; a second N-type semiconductor region coupled with the second P-type semiconductor region and connected to a ground terminal; and a trigger circuit configured to draw a trigger current from the first N-type semiconductor region when a surge is applied to the pad. The trigger circuit is connected to the first N-type semiconductor region through a resistive element.

20 Claims, 7 Drawing Sheets

US 7,495,265 B2

ESD PROTECTION CIRCUIT WITH SCR STRUCTURE FOR SEMICONDUCTOR DEVICE

BACKGROUND OF THE INVENTION

1. Field of the Invention

The present invention relates to a semiconductor device. In particular, the present invention relates to a semiconductor device provided with an electrostatic discharge (ESD) protection circuit that protects destruction of an internal circuit due to an ESD stress or an application of a surge.

2. Description of the Related Art

An ESD protection circuit is incorporated in a semiconductor integrated circuit so as to protect an internal circuit against a surge applied to an input and output pad. One of well-known topologies of the ESD protection circuit is a circuit topology using a silicon controlled rectifier (SCR). Japanese Laid Open Patent Application (JP-P2003-203985A) discloses an ESD protection circuit using an SCR. FIG. 1 is a cross-sectional view showing a structure of the ESD protection circuit disclosed in the patent document.

As shown in FIG. 1, the ESD protection circuit within the public domain has an SCR region 2 and a trigger circuit region 3 which are integrated on a P-type semiconductor substrate 1. The trigger circuit region 3 is isolated from the SCR region 2 by an STI (shallow trench isolation) layer 4 as an insulator.

An N-well 5 is formed in the SCR region 2, and an $N^+$ diffusion layer 6 and a $P^+$ diffusion layer 7 are formed in a surface portion of the N-well 5. Further, an $N^+$ diffusion layer 8 and a $P^+$ diffusion layer 9 are formed in a portion of the SCR region 2 outside of the N-well 5. The $N^+$ diffusion layer 6, the $P^+$ diffusion layer 7, the $N^+$ diffusion layer 8 and the $P^+$ diffusion layer 9 are isolated from one another by STI layers 10 as insulators. The $P^+$ diffusion layer 7, the N-well 5, a portion near a surface of the P-type semiconductor substrate 1, and the $N^+$ diffusion layer 8 function as an SCR having a pnpn structure. More specifically, the $P^+$ diffusion layer 7 functions as an anode of the SCR, the N-well 5 functions as a base thereof, and the $N^+$ diffusion layer 8 functions as a cathode thereof. On the other hand, the $N^+$ diffusion layer 6 and the $P^+$ diffusion layer 9 function as contact layers for realizing electrical connections to the N-well 5 and the P-type semiconductor substrate 1, respectively. The $P^+$ diffusion layer 7 is connected to an input and output (I/O) pad 11 used for inputting and outputting a signal to and from an internal circuit (not shown). The $N^+$ diffusion layer 8 and the $P^+$ diffusion layer 9 are connected in common to a grounding terminal 12.

The trigger circuit region 3 is a region in which a trigger circuit that turns on the above-mentioned SCR when a surge is applied to the I/O pad 11 is formed. In the ESD protection circuit shown in FIG. 1, an NMOS transistor 13 having a source and a gate connected in common to the grounding terminal 12 is used as the trigger circuit. More specifically, a source region 14 and a drain region 15 of $N^+$ conductive type are formed in a surface portion of the P-type semiconductor substrate 1. Further, a gate insulating layer 16 is formed on the surface of the P-type semiconductor substrate 1, and a gate electrode 17 is formed on the gate insulating layer 16. The gate electrode 17 typically includes a polysilicon layer 17a and a silicide layer 17b formed on the polysilicon layer 17a. Examples of the silicide layer 17b include a titanium silicide layer, a cobalt silicide layer, and a tungsten silicide layer. The drain region 15 is electrically connected to the $N^+$ diffusion layer 6 in the SCR region 2 through a metal wiring 18. The source region 14 and the gate electrode 17 are connected to the grounding terminal 12.

FIG. 2 shows an equivalent circuit of the ESD protection circuit shown in FIG. 1. The ESD protection circuit shown in FIG. 1 equivalently functions as a circuit that includes a PNP transistor 21, an NPN transistor 22, a substrate resistance $R_{SUB}$, an N-well resistance $R_{NW}$ and the NMOS transistor 13. An emitter of the PNP transistor 21 is connected to the I/O pad 11, a collector thereof is connected to the grounding terminal 12 through the substrate resistance $R_{SUB}$, and a base thereof is connected to a collector of the NPN transistor 22. A base of the NPN transistor 22 is connected to the collector of the PNP transistor 21, and an emitter thereof is connected to the grounding terminal 12. With regard to the NMOS transistor 13 that functions as the trigger circuit, a drain thereof is connected to the base of the PNP transistor 21 through the N-well resistance $R_{NW}$ and the metal wiring 18, and a source and a gate thereof are connected to the grounding terminal 12.

When a surge voltage is applied to the I/O pad 11, the ESD protection circuit shown in FIG. 1 operates as follows to protect the internal circuit. When the surge voltage is applied to the I/O pad 11, the surge voltage is applied to the drain of the NMOS transistor 13 through the emitter and base of the PNP transistor 21. If the surge voltage causes breakdown of the NMOS transistor 13, then a trigger current flows from the base of the PNP transistor 21 toward the grounding terminal 12, and the PNP transistor 21 is thereby turned on. When the PNP transistor 21 is turned on, an emitter-collector current flows from the emitter to the collector of the PNP transistor 21. The emitter-collector current flows into the grounding terminal 12 through the substrate resistance $R_{SUB}$. When the emitter-collector current flows through the substrate resistance $R_{SUB}$, a base potential of the NPN transistor 22 is increased due to a voltage drop at the substrate resistance $R_{SUB}$. When the base potential of the NPN transistor 22 is increased, a base current flows in the NPN transistor 22, and the NPN transistor 22 is thereby turned on. When the NPN transistor 22 is turned on, the surge voltage applied to the I/O pad 11 is discharged through the NPN transistor 22, and thus the internal circuit is protected.

The ESD protection circuit shown in FIG. 1 is advantageous in that a high discharge capability and a low trigger voltage can be simultaneously ensured because the SCR and the trigger circuit are isolated from each other. Specifically, the ESD protection circuit shown in FIG. 1 has the following advantages. First, since the SCR is isolated from the trigger circuit, a length of the base of the SCR can be designed to be small. This can enhance the discharge capability of the ESD protection circuit. Secondly, since the trigger circuit can be designed irrespective of the SCR, the trigger voltage can be arbitrarily designed in the ESD protection circuit shown in FIG. 1. This means that the ESD protection circuit shown in FIG. 1 satisfies both the high discharge capability and the low trigger voltage.

SUMMARY OF THE INVENTION

However, the ESD protection circuit shown in FIG. 1 has the following disadvantages. The ESD protection circuit may possibly operate at unnecessary time because of an inevitable increase in a parasitic capacity of a path through which the trigger current is carried. The parasitic capacity of the path through which the trigger current is carried is mainly derived from a drain capacity of the NMOS transistor 13. The NMOS transistor 13 needs to be large in size since the NMOS transistor itself should not be destructed by the surge voltage.

Accordingly, the drain capacity of the NMOS transistor 13, that is, the parasitic capacity of the path through which the trigger current flows is inevitably made large. However, if the parasitic capacity of the path through which the trigger current flows is large, the ESD protection circuit may unnecessarily operate when an abruptly rising voltage pulse is applied to the I/O pad 11, because the trigger current I flowing in the base of the PNP transistor 21 is represented by the following equation:

$$I = C(dV/dt),$$

wherein the trigger current I is increased in proportion to a time variation dV/dt of the voltage applied to the I/O pad 11 and the parasitic capacity C. If the time variation dV/dt of the voltage applied to the I/O pad 11 is large, a large trigger current is carried even when a voltage level of the voltage pulse applied to the I/O pad 11 is within a normal range. Such a large trigger current causes the ESD protection circuit to operate. It is desirable to prevent such a malfunction of the ESD protection circuit.

A semiconductor device according to the present invention has: a first P-type semiconductor region connected to a pad; a first N-type semiconductor region connected with the first P-type semiconductor region; a second P-type semiconductor region connected with the first N-type semiconductor region and connected to a ground terminal; a second N-type semiconductor region connected with the second P-type semiconductor region and connected to a ground terminal; and a trigger circuit configured to draw a trigger current from the first N-type semiconductor region when a surge is applied to the pad. The trigger circuit is connected to the first N-type semiconductor region through a resistive element.

In the semiconductor device thus constructed, an electrostatic destruction of the trigger circuit itself hardly occurs, because the resistive element is used for the electrical connection between the first N-type semiconductor region and the trigger circuit. Thus, the trigger circuit is allowed to be small in its size, namely, a parasitic capacity of the trigger circuit can be small. Therefore, the semiconductor device according to the present invention is capable of suppressing a malfunction of the ESD protection circuit caused by the large parasitic capacity of the path through which the trigger current flows.

According to the present invention, the parasitic capacity of the path through which the trigger current is carried can be reduced, and thereby the malfunction of the ESD protection circuit can be prevented.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
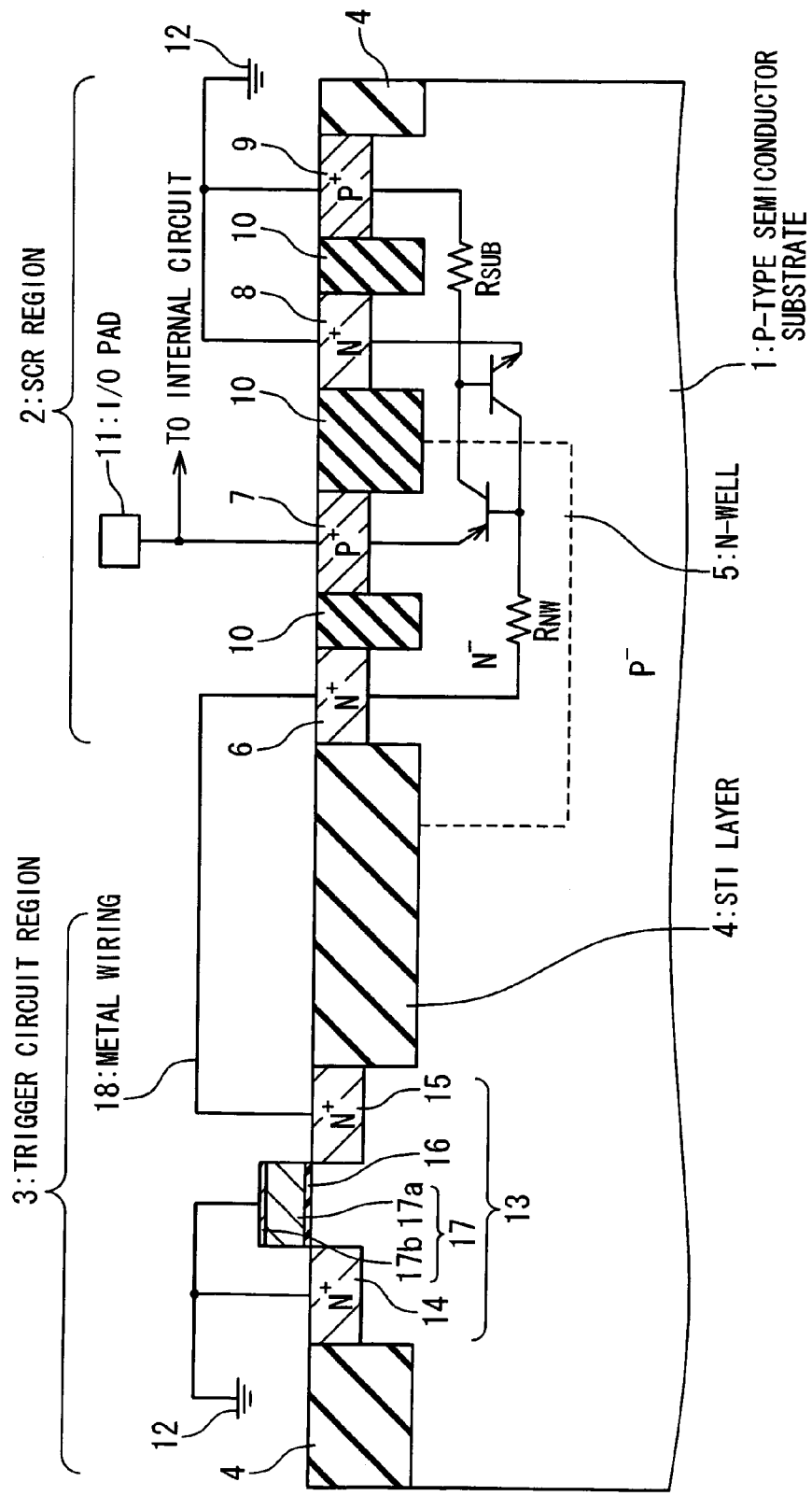
FIG. 1 is a cross-sectional view showing a structure of a conventional ESD protection circuit.

The invention will be now described herein with reference to illustrative embodiments. Those skilled in the art will recognize that many alternative embodiments can be accomplished using the teachings of the present invention and that the invention is not limited to the embodiments illustrated for explanatory purposed. It should be noted that the same or similar constituent elements are denoted by the same or corresponding reference numerals in the drawings.

Figure 3:
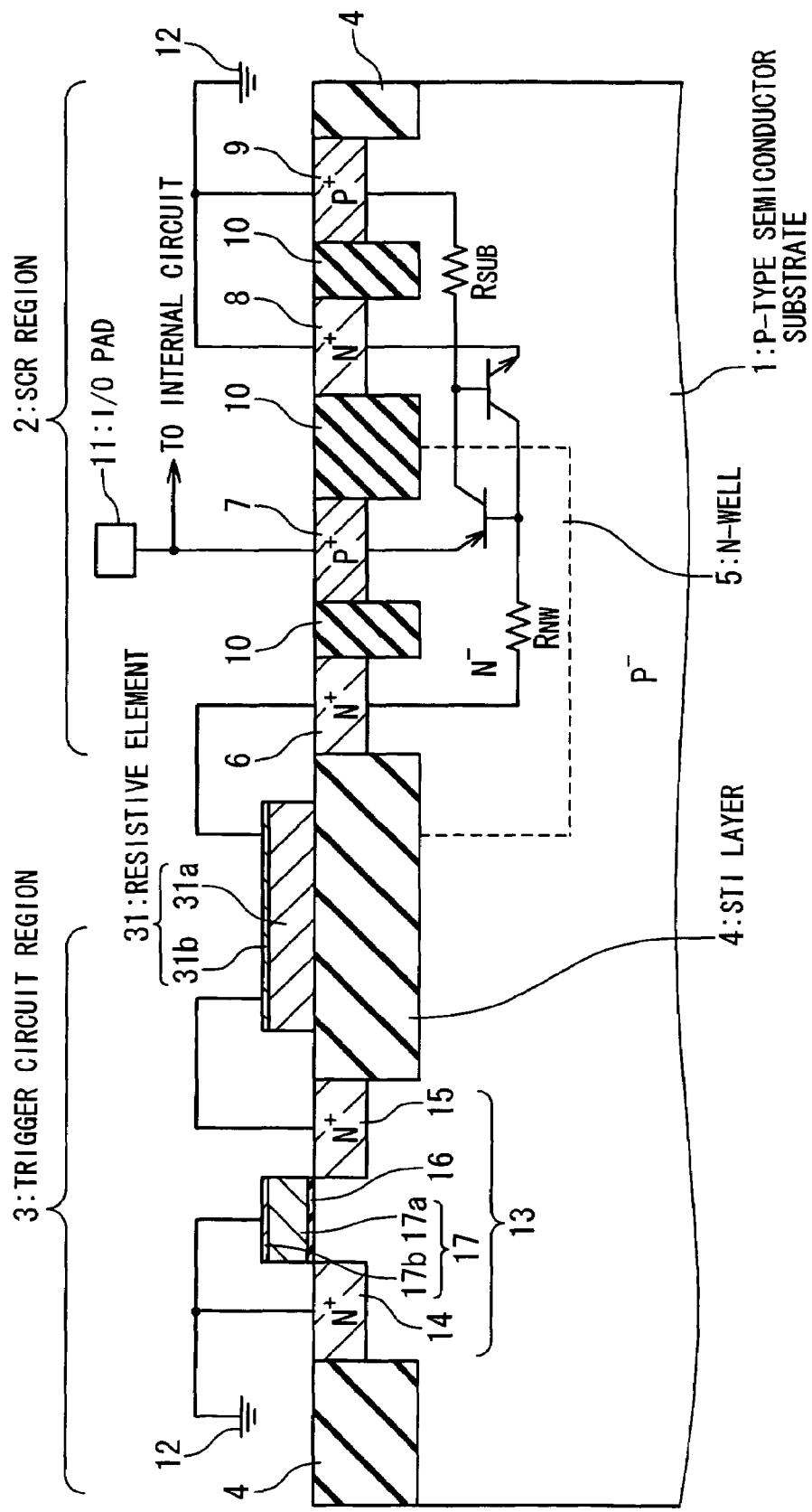
FIG. 3 is a cross-sectional view showing a structure of an ESD protection circuit incorporated in a semiconductor device according to an embodiment of the present invention.

FIG. 3 is a cross-sectional view showing a structure of an ESD protection circuit incorporated in a semiconductor device according to an embodiment of the present invention. The ESD protection circuit according to the present embodiment differs from the conventional ESD protection circuit shown in FIG. 1 in the following respect. The $N^+$ diffusion layer 6 in the SCR region 2 and the drain region 15 of the NMOS transistor 13 are connected through a resistive element 31. The remaining constituent elements of the ESD protection circuit according to the present embodiment are equal to those of the ESD protection circuit shown in FIG. 1. In the present embodiment, a multilayer structure that includes a polysilicon layer 31a formed on the STI layer 4 and a silicide layer 31b formed on the polysilicon layer 31a is used as the resistive element 31. Examples of the silicide layer 31b include a titanium silicide layer, a cobalt silicide layer, and a tungsten silicide layer.

Figure 2:
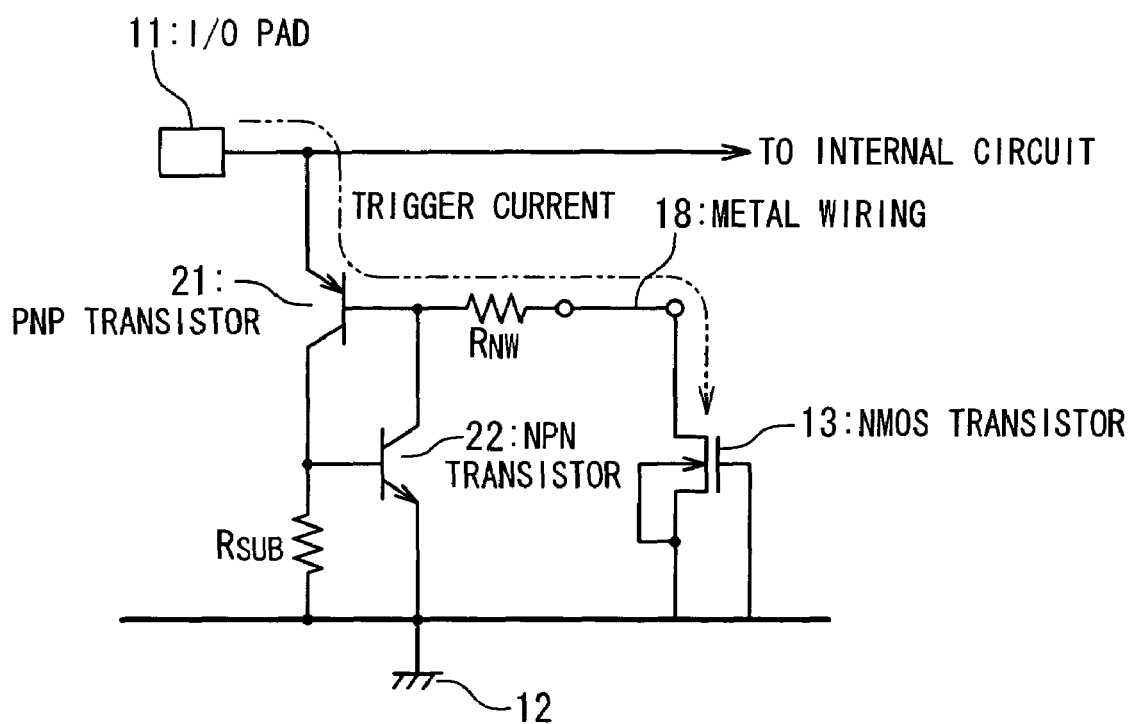
FIG. 2 is a circuit diagram showing an equivalent circuit of the conventional ESD protection circuit shown in FIG. 1.
Figure 4:
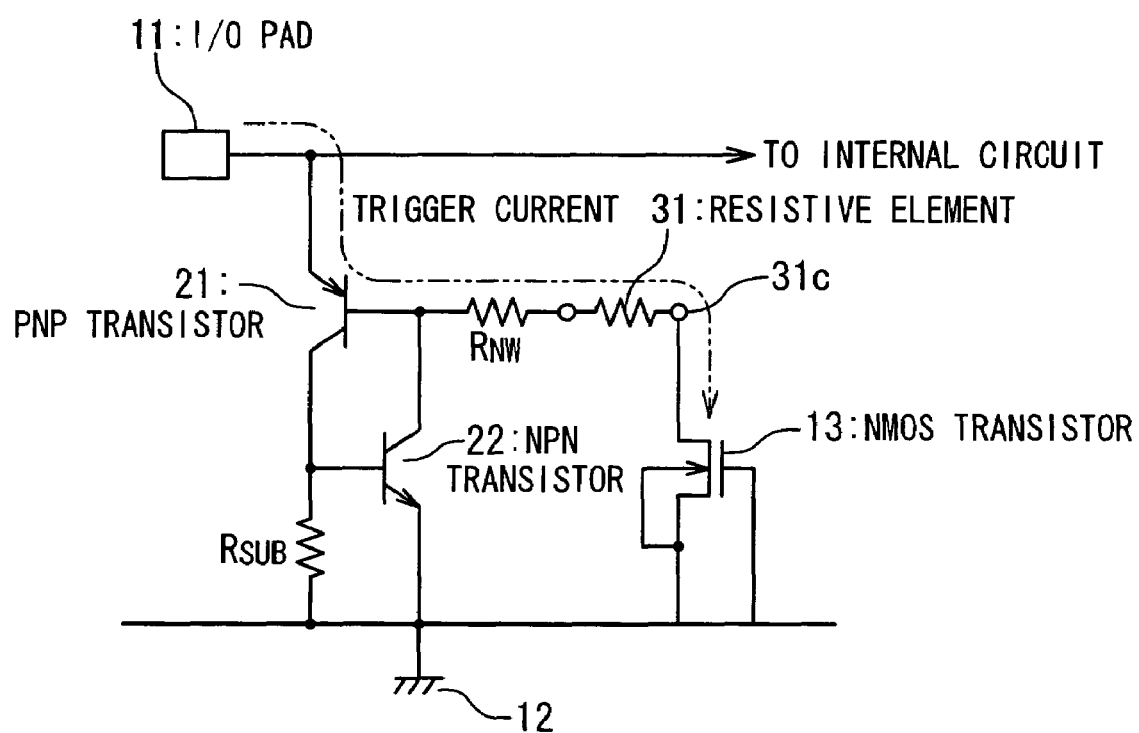
FIG. 4 is a circuit diagram showing an equivalent circuit of the ESD protection circuit according to the present embodiment.

FIG. 4 is a circuit diagram showing an equivalent circuit of the ESD protection circuit according to the present embodiment. The equivalent circuit of the ESD protection circuit according to the present embodiment is equal to the equivalent circuit of the ESD protection circuit shown in FIG. 2 except that the drain region 15 of the MOS transistor 13 is connected to the N-well resistance $R_{NW}$ through the resistive element 31. Accordingly, the ESD protection circuit according to the present embodiment operates similarly to the ESD protection circuit shown in FIG. 2. If a surge voltage is applied to the I/O pad 11, the surge voltage is applied to the drain of the NMOS transistor 13 through the emitter and base of the PNP transistor 21 and the resistive element 31. If the surge voltage causes a breakdown of the NMOS transistor 13, then a trigger current flows from the base of the PNP transistor 21 toward the grounding terminal 12, and the PNP transistor 21 is thereby turned on. When the PNP transistor 21 is turned on, an emitter-collector current flows from the emitter to the collector of the PNP transistor 21. The emitter-collector current flows into the grounding terminal 12 through the substrate resistance $R_{SUB}$. When the emitter-collector current flows through the substrate resistance $R_{SUB}$, a base potential of the NPN transistor 22 is increased due to a voltage drop at the substrate resistance $R_{SUB}$. When the base potential of the NPN transistor 22 is increased, a base current flows in the NPN transistor 22, and the NPN transistor 22 is thereby turned on. When the NPN transistor 22 is turned on, the surge voltage applied to the I/O pad 11 is discharged through the NPN transistor 22, and thus the internal circuit is protected.

The most important feature of the ESD protection circuit according to the present embodiment is as follows. Since the $N^+$ diffusion layer 6 is connected to the drain region 15 of the NMOS transistor 13 through the resistive element 31, an electrostatic destruction of the NMOS transistor 13 itself hardly occurs. Since the electrostatic destruction hardly occurs, it is possible to reduce a size of the NMOS transistor 13, i.e., to reduce a drain capacity of the NMOS transistor 13 in the ESD protection circuit according to the present embodiment. Therefore, the ESD protection circuit according to the present embodiment can reduce the parasitic capacity of the path through which the trigger current is carried. This is effective to suppress the malfunction of the ESD protection circuit.

Alternatively, a resistive element having a structure other than the multilayer structure that includes the polysilicon layer 31a and the silicide layer 31b can be used as the resistive element 31. For example, the resistive element 31 can be formed of a single polysilicon layer. Also, the resistive element 31 can be formed of a single tungsten silicide layer. Moreover, the resistive element 31 can have a multilayer structure that includes a tungsten silicide layer and a titanium nitride layer.

It should be noted, however, that it is preferable to use the single polysilicon layer or the multilayer of the polysilicon layer and the silicide layer as the resistive element 31 from the aspect of simplifying the manufacturing processes. When the single polysilicon layer or the multilayer that includes the polysilicon layer and the silicide layer is used as the resistive element 31, the resistive element 31 can be formed simultaneously with a gate of a MOS transistor. As a result, a specific process for forming the resistive element 31 becomes unnecessary, which simplifies the manufacturing processes.

As mentioned above, the resistive element 31 is allowed to have various structures. Nevertheless, it is unfavorable to use a diffusion resistance formed in the P-type semiconductor substrate 1 as the resistive element 31. In other words, it is preferable that the resistive element 31 is formed outside of the P-type semiconductor substrate 1. If the diffusion resistance is used as the resistive element 31, then a pn junction is formed in the P-type semiconductor substrate 1, and hence the parasitic capacity of the path through which the trigger current flows is increased. This reduces the above-mentioned advantage of suppressing the malfunction of the ESD protection circuit.

The resistive element 31 is preferably formed of a layer or a multilayer whose sheet resistance is equal to or higher than 1.0 Ω/sq. More preferably, its sheet resistance is equal to or higher than 5.0 Ω/sq. If the sheet resistance is excessively low, the NMOS transistor 13 cannot be sufficiently protected against the surge voltage. Therefore, the sheet resistance of the layer or the multilayer that constitutes the resistive element 31 is preferably equal to or lower than 1.0 kΩ/sq. Conversely, if the sheet resistance is excessively high, it becomes difficult to turn on the NMOS transistor 13 when the surge voltage is applied. As a result, the internal circuit cannot be sufficiently protected.

A configuration of the trigger circuit for turning on the SCR can be variously changed. FIGS. 5A to 5G are circuit diagrams showing examples of a configuration of a circuit that can be used as the trigger circuit. It should be noted in FIGS. 5A to 5G that a reference numeral 31c denotes a resistive element connection node connected to the resistive element 31.

Figure 5A:
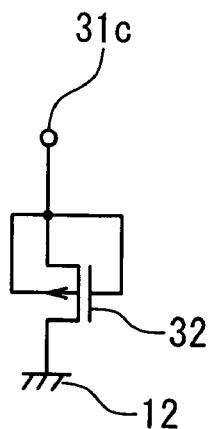
FIG. 5A is a circuit diagram showing another configuration of a trigger circuit.

As shown in FIG. 5A, a PMOS transistor 32 having a source and a gate connected to the resistive element 31 and having a drain connected to the grounding terminal 12 can be used as the trigger circuit.

Figure 5B:
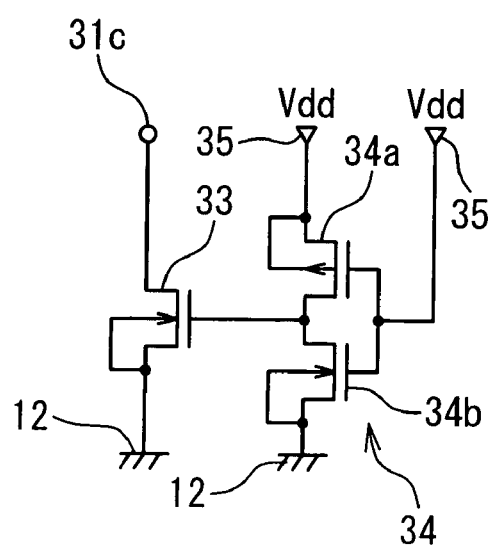
FIG. 5B is a circuit diagram showing still another configuration of the trigger circuit.

As shown in FIG. 5B, a trigger circuit constituted by an NMOS transistor 33 and an inverter 34 can be used as the trigger circuit. The NMOS transistor 33 has a drain connected to the resistive element 31 and a source connected to the grounding terminal 12. The inverter 34 is constituted by a PMOS transistor 34a connected in series between a power supply terminal 35 and the grounding terminal 12, and an NMOS transistor 34b. An output of the inverter 34 (i.e., drains of the PMOS transistor 34a and the NMOS transistor 34b) is connected to a gate of the NMOS transistor 33. An input of the inverter 34 (i.e., gates of the PMOS transistor 34a and the NMOS transistor 34b) is connected to the power supply terminal 35.

One feature of the trigger circuit shown in FIG. 5B is that the surge voltage causing the ESD protection circuit to operate can be set low since the NMOS transistor 33 is not completely turned off. When the semiconductor device provided with the ESD protection circuit is not powered on, the power supply terminal 35 is in a floating state, and both the PMOS transistor 34a and the NMOS transistor 34b of the inverter 34 are not completely turned on. Accordingly, the gate of the NMOS transistor 33 connected to the output of the inverter 34 is in a floating state, and the NMOS transistor 33 is not completely turned off. This makes it easier to cause the ESD protection circuit to operate when a surge voltage having a positive polarity relative to the grounding terminal 12 is applied to the I/O pad 11.

Figure 5C:
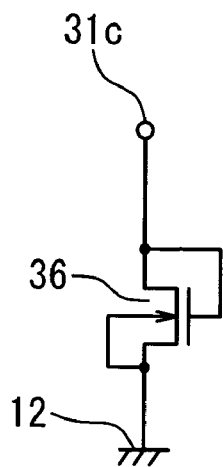
FIG. 5C is a circuit diagram showing still another configuration of the trigger circuit.

As shown in FIG. 5C, an NMOS transistor 36 having a drain and a gate connected to the resistive element 31 and a source connected to the grounding terminal 12 can be used as the trigger circuit. One feature of the trigger circuit shown in FIG. 5C is that the surge voltage causing the ESD protection circuit to operate can be set low. According to the trigger circuit shown in FIG. 5C, a surge voltage is applied to the gate of the NMOS transistor 36 when the surge voltage is applied to the I/O pad 11. This makes it easier to turn on the NMOS transistor 36.

Figure 5D:
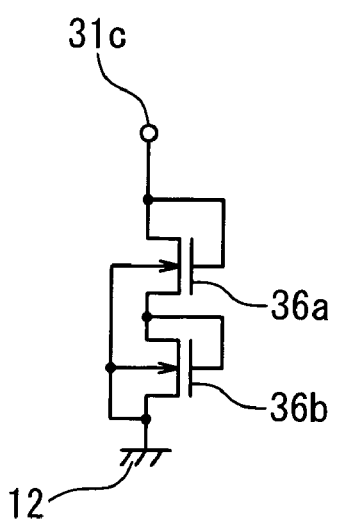
FIG. 5D is a circuit diagram showing still another configuration of the trigger circuit.

The trigger circuit shown in FIG. 5C may possibly be confronted with a problem that a high leakage current flows through the NMOS transistor 36. In order to avoid the leakage current problem, it is preferable that a gate length of the NMOS transistor 36 is sufficiently increased. As another approach, a plurality of NMOS transistors connected in series can be used as the trigger circuit, which is shown in FIG. 5D. FIG. 5D shows a trigger circuit configured such that two NMOS transistors 36a and 36b are connected in series. A drain and a gate of each of the NMOS transistors are connected to the resistive element 31 either directly or through another NMOS transistor. A source of each of the NMOS transistors is connected to the grounding terminal 12 either directly or through another NMOS transistor. In the example shown in FIG. 5D, the drain and the gate of the NMOS transistor 36a are directly connected to the resistive element 31, and the drain and the gate of the NMOS transistor 36b are connected to the resistive element 31 through the NMOS transistor 36a. Further, the source of the NMOS transistor 36a is connected to the grounding terminal 12 through the NMOS transistor 36b, and the source of the NMOS transistor 36b is directly connected to the grounding terminal 12.

Figure 5E:
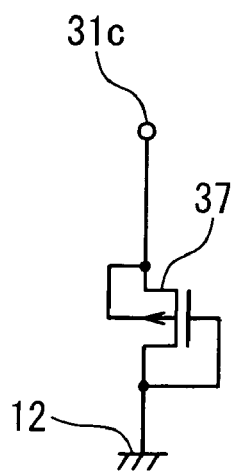
FIG. 5E is a circuit diagram showing still another configuration of the trigger circuit.

Furthermore, as shown in FIG. 5E, a PMOS transistor 37 having a source connected to the resistive element 31 and a drain and a gate connected to the grounding terminal 12 can be used as the trigger circuit. One feature of the trigger circuit shown in FIG. 5E is that the surge voltage causing the ESD protection circuit to operate can be set low. According to the trigger circuit shown in FIG. 5E, a gate of the PMOS transistor 37 is connected to the grounding terminal 12, which makes it easier to turn on the PMOS transistor 37.

Figure 5F:
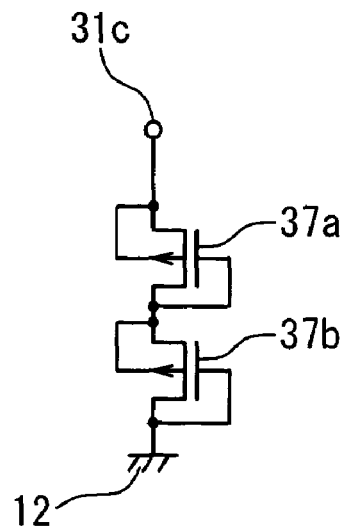
FIG. 5F is a circuit diagram showing still another configuration of the trigger circuit.

Similarly to the trigger circuit shown in FIG. 5C, the trigger circuit shown in FIG. 5E may possibly be confronted with a problem that a high leakage current flows through the PMOS transistor 37. In order to avoid the leakage current problem, it is preferable that a gate length of the PMOS transistor 37 is sufficiently increased. As another approach, a plurality of PMOS transistors connected in series can be used as the trigger circuit, which is shown in FIG. 5F. FIG. 5F shows a trigger circuit configured such that two PMOS transistors 37a and 37b are connected in series. A source of each of the PMOS transistors is connected to the resistive element 31 either directly or through another PMOS transistor. A drain and a gate of each of the PMOS transistors are connected to the grounding terminal 12 either directly or through another PMOS transistor. In the example shown in FIG. 5F, the source of the PMOS transistor 37a is directly connected to the resistive element 31, and the source of the PMOS transistor 37b is connected to the resistive element 31 through the PMOS transistor 37a. Further, the drain and the gate of the PMOS transistor 37a are connected to the grounding terminal 12 through the PMOS transistor 37b, and the drain and the gate of the PMOS transistor 37b are directly connected to the grounding terminal 12.

Figure 5G:
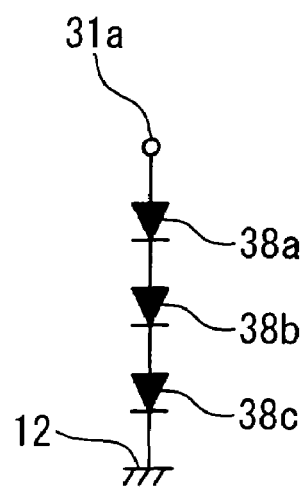
FIG. 5G is a circuit diagram showing still another configuration of the trigger circuit.

Moreover, as shown in FIG. 5G, a plurality of diodes connected in series in a forward direction from the resistive element 31 to the grounding terminal 12 can be used as the trigger circuit. FIG. 5G shows a trigger circuit constituted by three diodes 38a to 38c connected in series. According to the trigger circuit shown in FIG. 5G, it is possible to adjust the surge voltage causing the ESD protection circuit to operate and a leakage current flowing through the trigger circuit by changing the number of the plurality of diodes.

It is apparent that the present invention is not limited to the above embodiment, and that may be modified and changed without departing from the scope and spirit of the invention.

What is claimed is:

1. An ESD protection structure, comprising:
a first P-type semiconductor region connected to a pad;
a first N-type semiconductor region coupled with said first P-type semiconductor region;
a second P-type semiconductor region coupled with said first N-type semiconductor region and connected to a ground terminal;
a second N-type semiconductor region coupled with said second P-type semiconductor region and connected to a ground terminal;
a trigger circuit configured to draw a trigger current from said first N-type semiconductor region when a surge is applied to said pad;
a resistive element electrically connected between the trigger circuit and the first N-type semiconductor region; and
a shallow trench isolation region configured to electrically insulate the tripper circuit and the first N-type semiconductor region,
wherein the resistive element is provided over the shallow trench isolation region.

2. The ESD protection structure according to claim 1, wherein said first P-type semiconductor region, said first N-type semiconductor region, said second P-type semiconductor region and said second N-type semiconductor region are integrated on a semiconductor substrate, and said resistive element is formed outside of said semiconductor substrate.

3. The ESD protection structure according to claim 2, wherein said resistive element comprises a structure including a polysilicon layer.

4. The ESD protection structure according to claim 1, wherein said resistive element comprises of a layer or a multilayer whose sheet resistance is equal to or higher than 1.0 $\Omega$/sq.

5. The ESD protection structure according to claim 1,
wherein said first N-type semiconductor region comprises an N-well formed in a semiconductor substrate,
wherein said first P-type semiconductor region comprises a P+ diffusion layer formed in said N-well,
wherein said second P-type semiconductor region comprises a P-type region which is a part of said semiconductor substrate, and
wherein said second N-type semiconductor region comprises an N+ diffusion layer formed in said semiconductor substrate.

6. The ESD protection structure according to claim 1, wherein said trigger circuit comprises an NMOS transistor whose drain is connected to said first N-type semiconductor region through said resistive element.

7. The ESD protection structure according to claim 6, wherein a gate and a source of said NMOS transistor are connected to a ground terminal.

8. The ESD protection structure according to claim 6,
wherein a source of said NMOS transistor is connected to a ground terminal, and
wherein a gate of said NMOS transistor is connected to a power supply terminal through at least one MOS transistor and to a ground terminal through at least one MOS transistor.

9. The ESD protection structure according to claim 6, wherein a gate of said NMOS transistor is electrically connected to said first N-type semiconductor region through said resistive element via a first wire element that connects the gate of said NMOS transistor to the resistive element end via a second wire element that connects the resistive element to the first N-type semiconductor region.

10. The ESD protection structure according to claim 1, wherein said trigger circuit comprises a PMOS transistor whose source is connected to said first N-type semiconductor region through said resistive element.

11. The ESD protection structure according to claim 10, wherein a gate of said PMOS transistor is electrically connected to said first N-type semiconductor region through said resistive element via a first wire element that connects the gate of said NMOS transistor to the resistive element and via a second wire element that connects the resistive element to the first N-type semiconductor region.

12. The ESD protection structure according to claim 10,
wherein a gate of said PMOS transistor is connected to a drain thereof, and
wherein said drain of said PMOS transistor is connected to a ground terminal directly or through another PMOS transistor.

13. The ESD protection structure according to claim 1, wherein said trigger circuit comprises a plurality of diodes which are connected in series in a forward direction from said resistive element to a ground terminal.

14. The ESD protection structure according to claim 1, further comprising a shallow trench isolation layer provided between the the first N-type semiconductor region to the second N-type semiconductor region,
 wherein the resistive element is provided on the shallow trench isolation layer.

15. The ESD protection structure according to claim 14, wherein the resistive element electronically connects the first N-type semiconductor region to the second N-type semiconductor region.

16. The ESD protection structure according to claim 14, wherein the resistive element comprises a polysilicon layer provided on the shallow trench isolation layer and a silicide layer provided on the polysilicon layer.

17. The ESD protection structure according to claim 14, wherein the polysilicon layer is provided on a shallow trench isolation layer.

18. The ESD protection structure according to claim 1, wherein the resistive element electronically connects the first N-type semiconductor region to the second N-type semiconductor region, and
 wherein the resistive element comprises a polysilicon layer and a silicide layer provided on the polysilicon layer.

19. The ESD protection structure according to claim 8, wherein the trigger circuit further comprises an inverter comprising a PMOS transistor electrically connected in series between the power supply terminal and the ground terminal, and another NMOS transistor.

20. The ESD protection structure according to claim 19, wherein when a semiconductor device electrically connected to the ESD is not powered on, the power supply terminal is in a floating state and both the PMOS transistor and the another NMOS transistor of the inverter are not completely turned off.

* * * * *